United States Patent [19]
Samukawa et al.

[11] Patent Number: 5,936,352
[45] Date of Patent: Aug. 10, 1999

[54] PLASMA PROCESSING APPARATUS FOR PRODUCING PLASMA AT LOW ELECTRON TEMPERATURES

[75] Inventors: Seiji Samukawa; Tsutomu Tsukada; Yukito Nakagawa, all of Tokyo; Kibatsu Shinohara, Kanagawa; Hirofumi Matsumoto, Kanagawa; Hiroyuki Ueyama, Kanagawa, all of Japan

[73] Assignees: NEC Corporation, Tokyo; Nihon Koshua Co., Ltd., Kanagawa; Anelva Corporation, Tokyo, all of Japan

[21] Appl. No.: 08/753,090

[22] Filed: Nov. 20, 1996

[30] Foreign Application Priority Data

Nov. 28, 1995 [JP] Japan .................................... 7-308892
Jun. 17, 1996 [JP] Japan .................................... 8-155422

[51] Int. Cl.$^6$ .................................................. H05B 37/00
[52] U.S. Cl. ............................... 315/111.51; 315/111.21; 315/111.41; 216/70; 216/71; 118/723 I; 204/298.34; 204/298.06
[58] Field of Search .......................... 315/111.51, 111.81, 315/111.21, 111.41; 156/345; 118/723 I; 204/298.06, 298.34; 216/70, 71

[56] References Cited

U.S. PATENT DOCUMENTS

| | | | |
|---|---|---|---|
| 5,397,962 | 3/1995 | Moslehi | 315/111.51 |
| 5,401,350 | 3/1995 | Patrick et al. | 118/723 I X |
| 5,464,476 | 11/1995 | Gibb et al. | 118/723 MP |
| 5,565,738 | 10/1996 | Samukawa et al. | 315/111.51 |

FOREIGN PATENT DOCUMENTS

| | | |
|---|---|---|
| 60-134423 | 7/1985 | Japan . |
| 3-68773 | 3/1991 | Japan . |
| 3-79025 | 4/1991 | Japan . |

*Primary Examiner*—Arnold Kinkead
*Attorney, Agent, or Firm*—Sughrue, Mion, Zinn, Macpeak & Seas, PLLC

[57] ABSTRACT

A plasma processing apparatus includes a plasma chamber and an antenna formed by a first set of parallel antenna elements and a second set of parallel antenna elements, the antenna elements of the first set being interdigitally arranged with those of the second set. An energy source supplies oscillation energy of first phase to the first set of antenna elements and oscillation energy of second, opposite phase to the second set of antenna elements to produce oppositely moving energy fields in the chamber at such a frequency that electrons are confined in a plasma produced in the chamber.

28 Claims, 6 Drawing Sheets

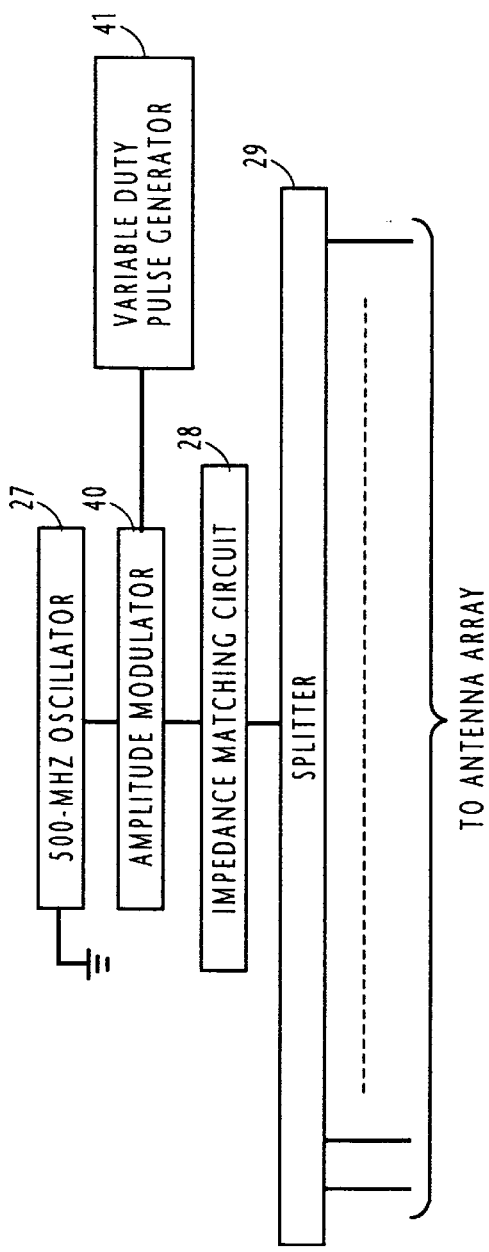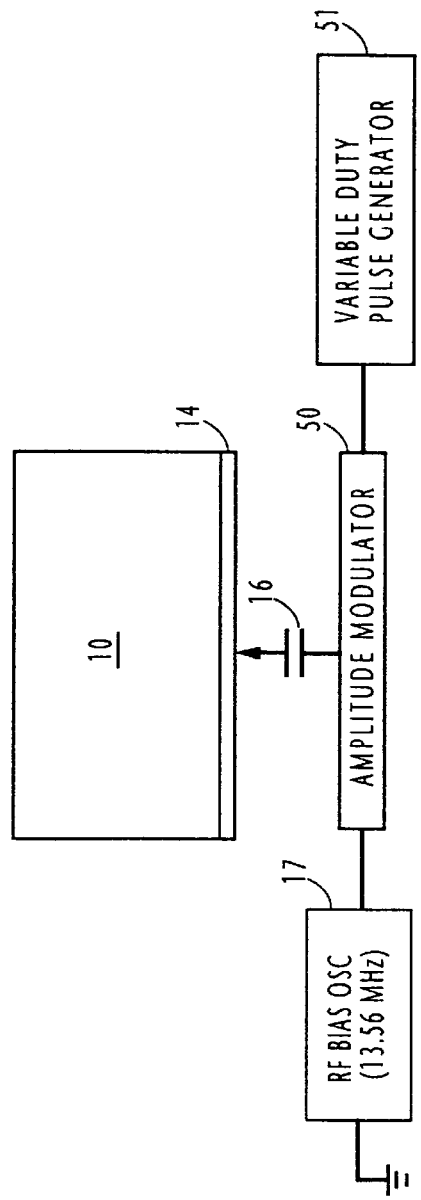

PLASMA PROCESSING APPARATUS FOR PRODUCING PLASMA AT LOW ELECTRON TEMPERATURES

RELATED PATENT

The present invention is related to co-pending U.S. patent Ser. No. 08/440,453, filed May 12, 1995, titled "Plasma Processing Apparatus Which Uses a Uniquely Shaped Antenna to Reduce the Overall Size of the Apparatus with Respect to the Plasma Chamber", Seiji Samukawa et al., and assigned to the same assignee as the present invention, the co-pending application being granted a U.S. Pat. No. 5,565,738, Oct. 15, 1996.

BACKGROUND OF THE INVENTION

1. Field of the Invention

The present invention relates to a plasma processing apparatus using an antenna for producing high frequency energy fields in a plasma chamber.

2. Description of the Related Art

The plasmas used in conventional plasma assisted etching are surface wave (Whistler wave) plasmas (SWP), electron cyclotron resonance plasmas (ECR) and induction coupled plasmas (ICP). As disclosed in Japanese Laid-Open Patent Specification Hei-3-68773, the plasma processing apparatus of the SWP method includes an antenna surrounding the upper part of a plasma chamber. The antenna is connected to a high frequency source (several tens of megahertz) to produce a Whistler wave in the plasma generation chamber. A solenoid is provided for producing a magnetic field in a direction parallel to the vertical axis of the upper part of the plasma chamber. The lower part of the chamber is a plasma dispersion area which is surrounded by a plurality of parallel permanent magnets co confine electrons. A wafer platen is supported in the lower part of the chamber and connected to an RF bias oscillator.

The ECR etching method is one in which microwave plasma etching occurs in a discharge chamber utilizing a resonance between the cyclotron motion of electrons in magnetic and microwave fields, as typically disclosed in Japanese Laid-Open Patent Specification Sho-60 -134423.

The ICP method, as disclosed in Japanese Laid-Open Patent Specification Hei-3-79025, uses a spiral coil mounted on a plasma chamber. High frequency energy (several tens of megahertz) is applied to the coil and a wafer platen placed in the chamber to produce high frequency electromagnetic fields.

Although high-density plasmas can be obtained by these prior art techniques, there is one disadvantage in that an excessively great number of active (high energy) electrons are produced in a plasma and the reactive gases are excessively dissociated by the active electrons, so that the plasma is maintained at high electron temperatures. Because of the excessive dissociation, the selectivity (defined as the ratio of etch rates between different materials) of plasma assisted etching on a silicon substrate through a silicon-dioxide mask is as high as 12:1. Due to the high electron temperatures, a large amount of electrons accumulate on the sidewalls of holes in the silicon-dioxide mask and electrons impinging through the holes tend to diverge as they move past the holes into deeper areas of etched silicon substrate, producing a difference in pattern width between the mask and the substrate (i.e., low selectivity). As a result, etch rate must be varied with pattern width in order to obtain a high selectivity.

SUMMARY OF THE INVENTION

It is therefore an object of the present invention to provide a plasma processing apparatus capable of etching a silicon wafer with higher selectivities than is attainable with the prior art plasma assisted etching techniques by maintaining a plasma at low electron temperatures.

According to a broader aspect of the present invention, there is provided a plasma processing apparatus comprising a plasma chamber, an antenna array mounted adjacent the chamber, the antenna array comprising a first set of parallel antenna elements and a second set of parallel antenna elements interdigitally arranged with the antenna elements of the first set, a wafer platen in the chamber, and an energy source for supplying oscillation energy of first phase to the first set of antenna elements and oscillation energy of second, opposite phase to the second set of antenna elements to produce oppositely moving energy fields in the plasma chamber at such a frequency that electrons are confined in a plasma produced in the chamber.

According to a specific aspect, the present invention provides a plasma processing apparatus comprising a plasma chamber formed by an electrically conductive top member, a dielectric cylindrical side member and a bottom member, a cylindrical structure formed by an electrically conductive annular top member, a cylindrical side member and an electrically conductive annular bottom member, a first set of parallel antenna elements secured to the electrically conductive annular top member and a second set of parallel antenna elements secured to the electrically conductive annular bottom member, the antenna elements of the first set being interdigitally arranged with the antenna elements of the second set, a wafer platen in the chamber, and an energy source for supplying oscillation energy of first phase to the first set of antenna elements and oscillation energy of second, opposite phase to the second set of antenna elements to produce oppositely moving energy fields in the chamber at such a frequency that electrons are confined in a plasma produced in the chamber.

BRIEF DESCRIPTION OF THE DRAWINGS

The present invention will be described in further detail with reference to the accompanying drawings, in which:

FIG. 4 is a block diagram of a modified form of the high frequency energy source;

FIG. 5 is a block diagram of a modified form of the RF bias source;

DETAILED DESCRIPTION

Figure 1:
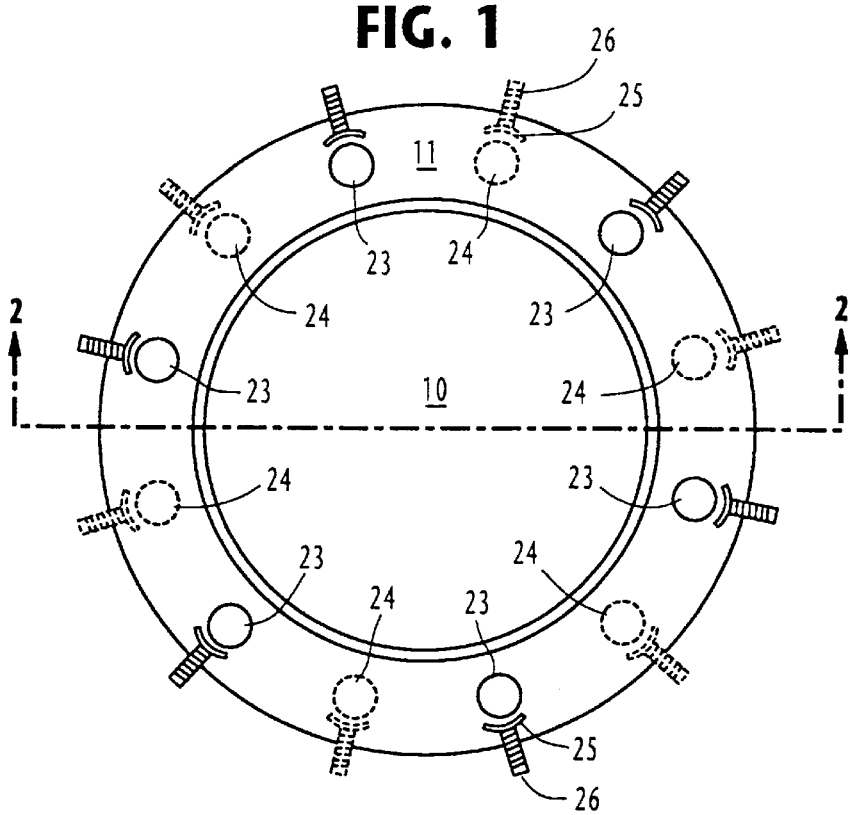
FIG. 1 is a plan view of a plasma processing apparatus according to the present invention.
Figure 2:
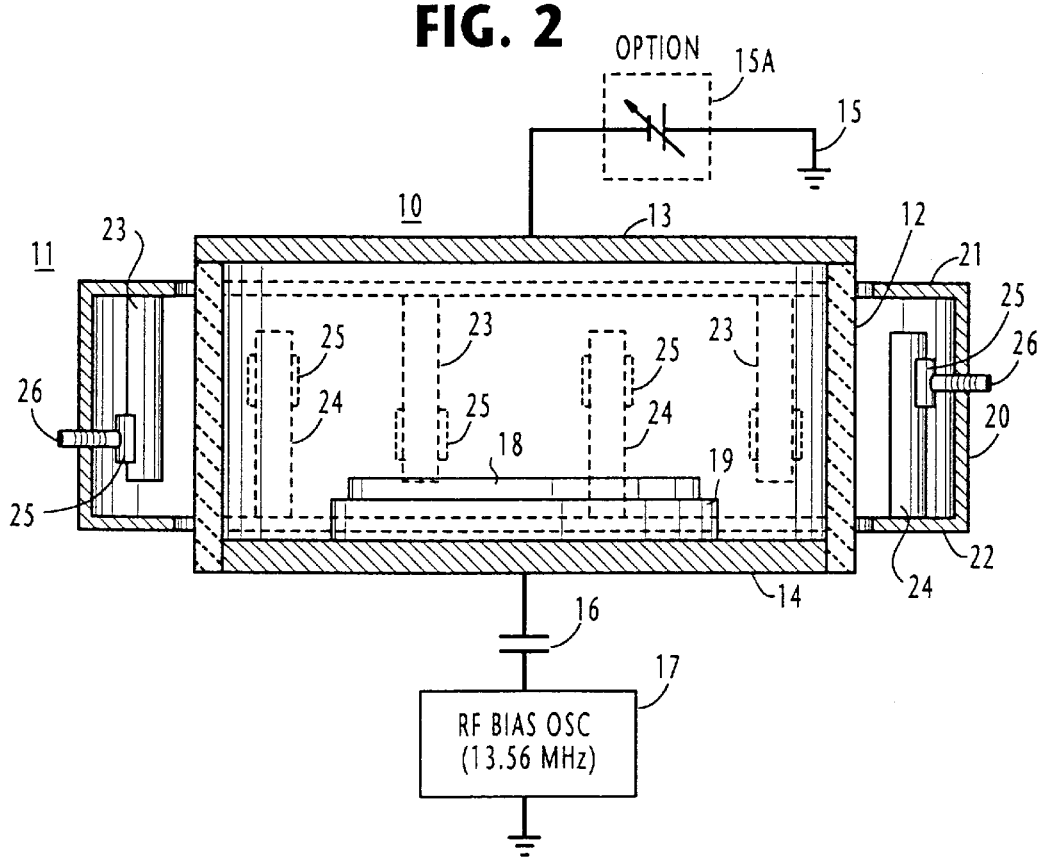
FIG. 2 is a vertical cross-sectional view taken along the line 2 of FIG. 1.

In FIGS. 1 and 2, a plasma processing apparatus of this invention comprises a plasma chamber 10 of cylindrical structure surrounded by an external structure, or antenna structure 11.

The plasma chamber 10 is formed by a cylindrical member 12 of dielectric material such as quartz, and top and bottom members 13 and 14 of electrically conductive material. In a typical example, the chamber has a diameter of 500 mm and is provided with gas inlet and exhaust openings, not shown, and provisions are made co maintain a desired low pressure when reactive gases are introduced. To produce an RF bias field, the top member 13 is grounded at 15 and the bottom member 14 is connected through a capacitor 16 from an RF bias oscillator 17 operating at 13.56 MHz. A specimen wafer 18 is placed on a platen 19 secured to the bottom member 14.

The antenna structure 11 is formed with a cylindrical side member 20, an annular top member 20A and an annular bottom member 20B. The side member 20 defines the outer wall of antenna 11 and has a vertical length smaller than the vertical dimension of the plasma chamber 10. The inner diameter of the top and bottom members 21, 22 is slightly greater than the diameter of the chamber 10 and their inner edges define a space which is open towards the chamber 10. Within the antenna structure 11 are provided an interdigital array of parallel antenna elements comprising a first set of antenna elements 23 extending downwards from the annular top member 21 and a second set of antenna elements 24 extending upwards from the annular bottom member 22, all the antenna elements being of a cylindrical shape of same dimensions. The antenna elements of each set are arranged alternately with those of the other set along the inside of the wall 20. The electrical length of each antenna element of both sets is equal to a quarter of the wavelength of high frequency excitation energy supplied to these antenna elements.

Each of the antenna elements 23, 24 is capacitively coupled to ground through a variable capacitive element formed by a part-cylindrical conductive member 25 secured to one end of an adjusting screw 26. Each adjusting screw is threaded through the wall 20 so that it can be manually rotated from the outside to adjust the spacing between the respective antenna element and the part-cylindrical member 25. The capacitance value, and hence the electrical length of each antenna element can be precisely adjusted in this way. For an energization frequency of 500 MHz, each antenna element has the quarter wavelength of 15 cm. If their physical length is 10 cm, an additional 5 cm can be obtained by adjusting the respective variable capacitances.

Figure 3:
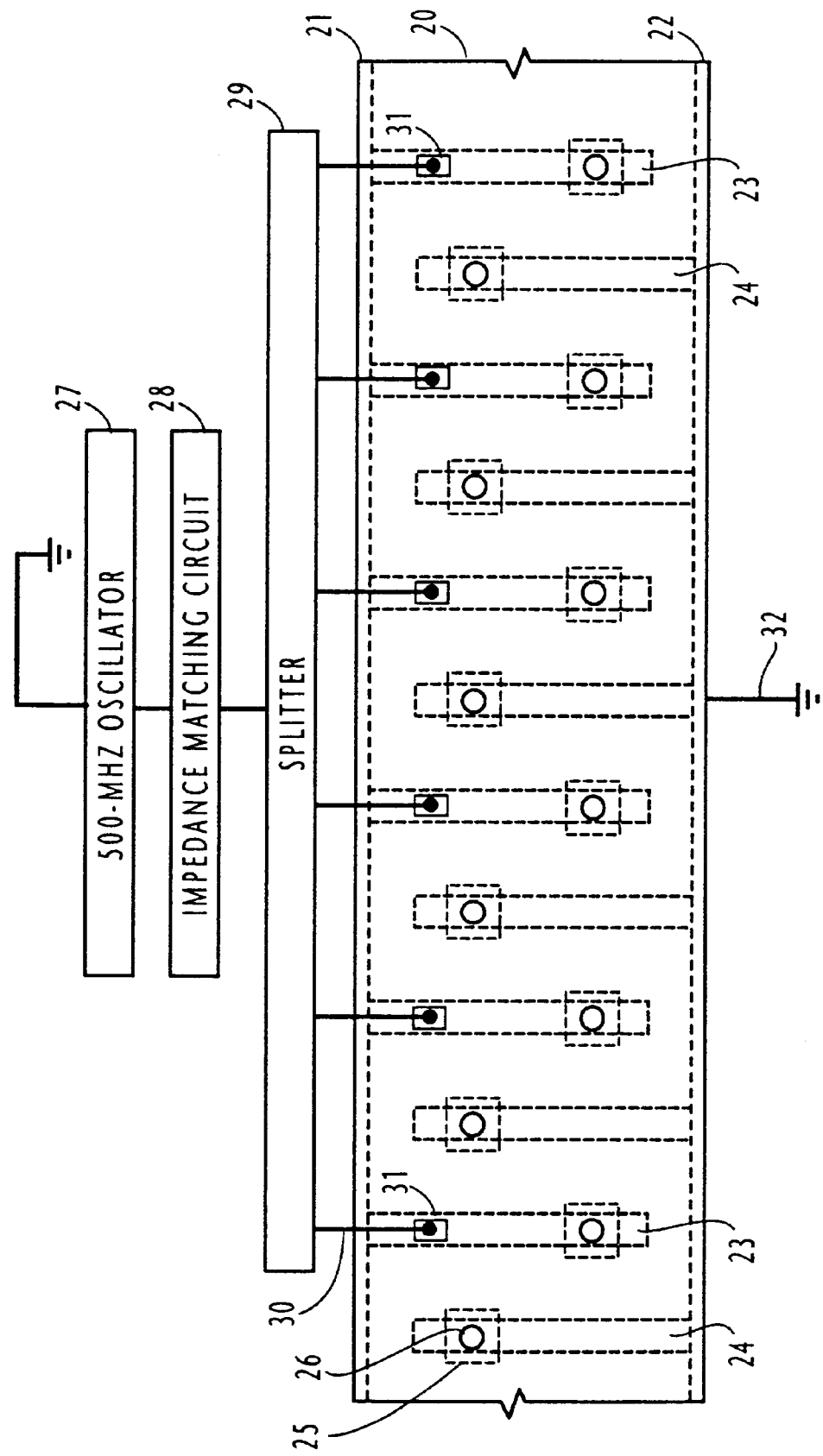
FIG. 3 is an expanded view of the antenna structure of FIG. 1 connected to a high frequency energy source.

In FIG. 3 where the antenna array is shown in an expanded form, a 500-MHz oscillator 27 supplies the excitation energy through an impedance matching circuit 28 to a splitter 29 where the energy is split and distributed via lines 30 to connectors 31 attached to the antenna elements 23 of the hanging set. The antenna elements 24 of the upstanding set, on the other hand, are connected to ground by a connection 32. As a result, a high-frequency electromagnetic field is generated around each hanging antenna element 23 and a high-frequency electromagnetic field is also generated around each adjacent upstanding antenna element 24 by inductive currents. As high frequency currents flow in die respective antenna elements 24 the fields generated around these elements move in a direction opposite to the movement of the fields produced around antenna elements 23. Therefore, electrons in the plasma chamber 10 are accelerated in a direction parallel to the vertical axis of the chamber by the fields produced by antenna elements 23 and change their directions by the opposite-going fields produced by antenna elements 24. Electrons are therefore exposed to successive cycles of accelerating and decelerating fields at frequency 500 MHz.

Because of the parallel arrangement of antenna elements, the fields produced by the two sets of antenna elements have a retarding effect on the accelerated electrons during the next decelerating cycle to such a degree that little or no energy would be imparted to the electrons and a difficulty would be encountered to maintain discharge. However, some of the accelerated electrons collide with the reactive gas molecules, change their directions, and then accelerated during the next (decelerating) cycle in a direction opposite to the direction of movement of the previous (accelerating) cycle. As a result, the average speed of electrons is restricted and a fairly large amount of appropriately accelerated electrons are confined in a plasma, leaving some electrons which may be greatly accelerated to become excessively active. However, such excessively active electrons escape from the plasma and annihilate as they hit the top or bottom member of the chamber 10. Since electrons are liberated from the gas molecules on collision with electrons during an accelerating cycle and the liberated electrons are accelerated in the reverse direction during the next decelerating cycle, the annihilated electrons are replenished to sustain the acceleration process.

Thus, the plasma is maintained and the number of excessively active electrons which would otherwise cause excessive dissociation of reactive gases is significantly small in comparison with the prior art plasma assisted etching methods. In addition, because of the parallel arrangement of antenna elements, high frequency magnetic cusp fields are produced in the chamber 10. Due to the magnetic cusp fields, the plasma has a uniform density. A high uniform density plasma can therefore be obtained at electron temperatures (i.e., electronvolts) much lower than those of the prior art.

Since the top member 13 is of electrically conductive material, the dielectric wall member 12 is not required to have a sufficient thickness to support an otherwise heavy material such as dielectric. For a plasma chamber 1 with a diameter of 400 mm and a height of 100 mm, it is sufficient for the dielectric wall member 12 to support the top member 13 with a thickness of 5 mm. This is advantageous for efficient transfer of high-frequency energy from the antenna array to the plasma.

In addition, since the variable capacitance elements are used to obtain a desired electrical length for the antenna array while keeping a small physical length as described earlier, the plasma chamber 10 can be designed to achieve a low profile. The low profile structure is advantageous in view of the narrow thickness feature of the side wall member 12. The low profile structure has a further benefit because the area of dielectric side member 12 that is exposed to a plasma is less for a low profile chamber than it is for a high profile chamber. The smaller exposure of dielectric to plasma is a desirable feature because it reduces the adverse effect of undesired gas molecule emissions from the dielectric wall member 12 if sputtering extends outwards to the side wall member and the latter is eroded by reactive molecules.

Returning to FIG. 2, a variable DC voltage source 15A is provided, as an option, between ground and the top member 13. The provision of this variable DC voltage source is to maintain the plasma in the chamber 10 at a desired low potential so that the sputtering area is limited to prevent it from eroding the inner walls of the dielectric member 12.

In a preferred embodiment, the power level of the plasma is controlled by modulating the oscillators with variable duty pulses as shown in FIGS. 4 and 5. In FIG. 4, an amplitude modulator 40 modulates the amplitude of the 500-MHz energy with lower frequency pulses from a variable width pulse generator 41 and feeds the impedance matching circuit 28. Similarly, an amplitude modulator 50 is provided between RF bias oscillator 17 and capacitor 16 to modulate the amplitude of the 13.56-MHz bias energy with lower frequency pulses from a variable width pulse generator 51. By appropriately varying the duty ratios of the modulating pulses, the plasma power can be precisely controlled to desired level. In a typical example, the duty ratio of each modulating pulse is varied in the range between 1:1 and 1:10.

Figure 6:
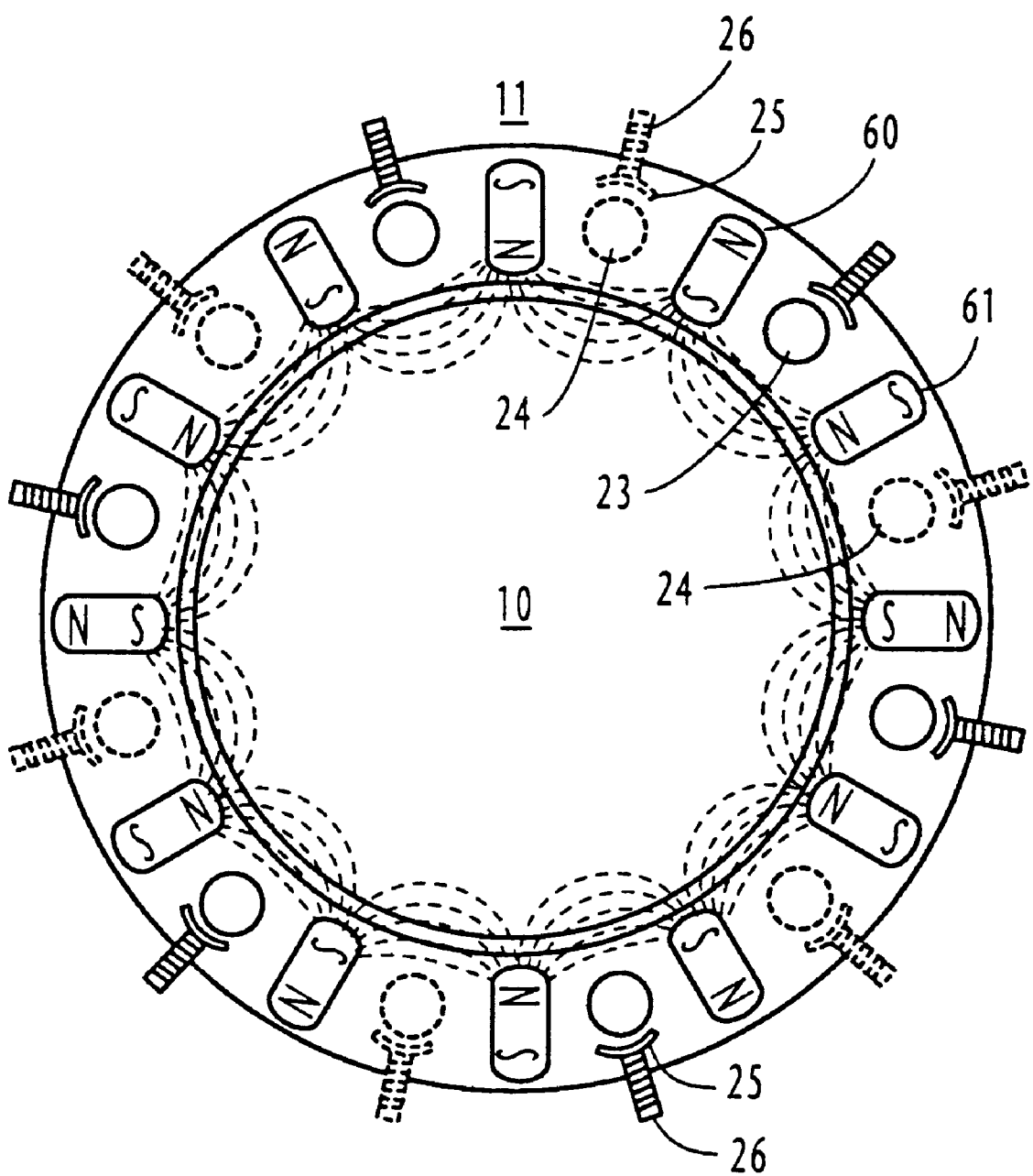
FIG. 6 is a plan view of a plasma chamber and an antenna structure on which an array of permanent magnets is provided.

In FIG. 6, a plurality of permanent magnets 60, 61 are arranged on the top of antenna 11 so that each magnet is positioned between adjacent antenna elements 23 and 24 and oriented in the opposite direction of magnetization to adjacent magnets to produce a high density static magnetic (cusp) field in the space between successive antenna elements 23 and 24. The excessively active electrons that escaped from the plasma reach the inner walls of the chamber 10, but change their directions under the influence of the static magnetic fields so that the electrons are confined in the plasma The electron loss at the side wall of the plasma chamber 10 is reduced. The advantage of this arrangement is that a plasma can be maintained at still lower electron temperatures.

Figure 7:
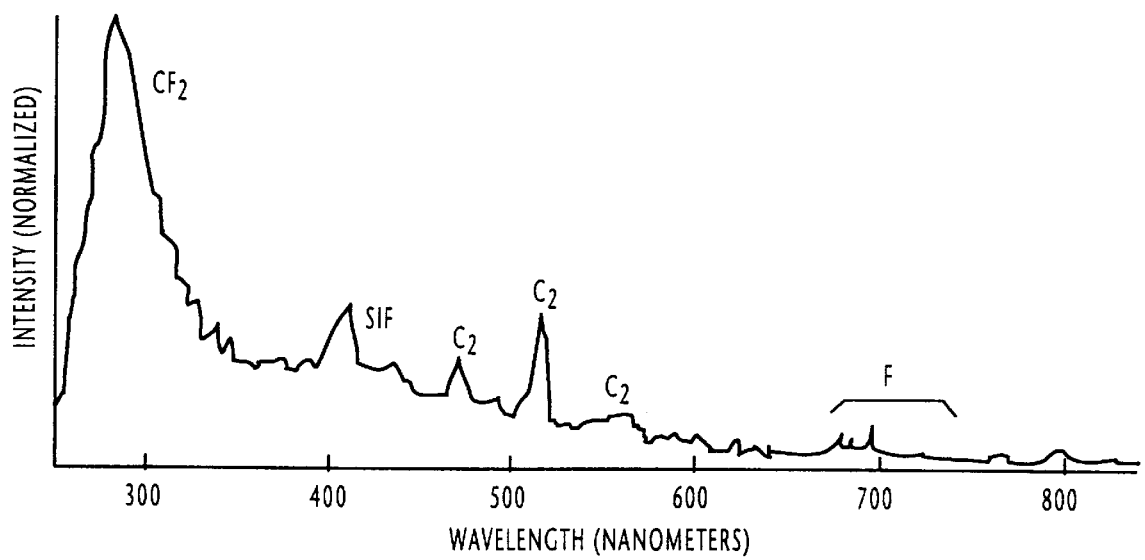
FIG. 7 is a spectral profile of a plasma produced by the present invention.

According to experiments, a $C_4F_8$ plasma was used for etching a silicon-dioxide coated silicon wafer by applying 500-MHz frequency energy at 1000 warts to the antenna array and subjecting the wafer to 300-watt of energy from the plasma. The electron temperature inside the plasma was measured at 1 to 2 electronvolts, which are lower than those of conventional plasma processing apparatus (usually, 4 to 8 electronvolts). Normalized spectral intensities of the plasma are shown in FIG. 7. Because of the low electron temperatures, the rate of dissociation of reactive gases is low, and hence the $CF_2$ radical has a significantly higher spectral intensity than other radicals as indicated in FIGS. 7. The experiments involved etching a silicon wafer through a silicon-dioxide layer at a rate of 700 nm/rnin. The results indicate that a selectivity of 50 (or greater):1 (defined as the ratio of etch rates between silicon-dioxide and silicon) was obtained for a 0.5-$\mu$m diameter hole. A greater selectivity was obtained by using a reactive gas of relatively high C/F ratio or a hydrogen-containing gas such as $CH_2F_2$. Using such reactive gases, an infinite value of selectivity was obtained for a 1 -$\mu$m diameter hole.

Figure 8:
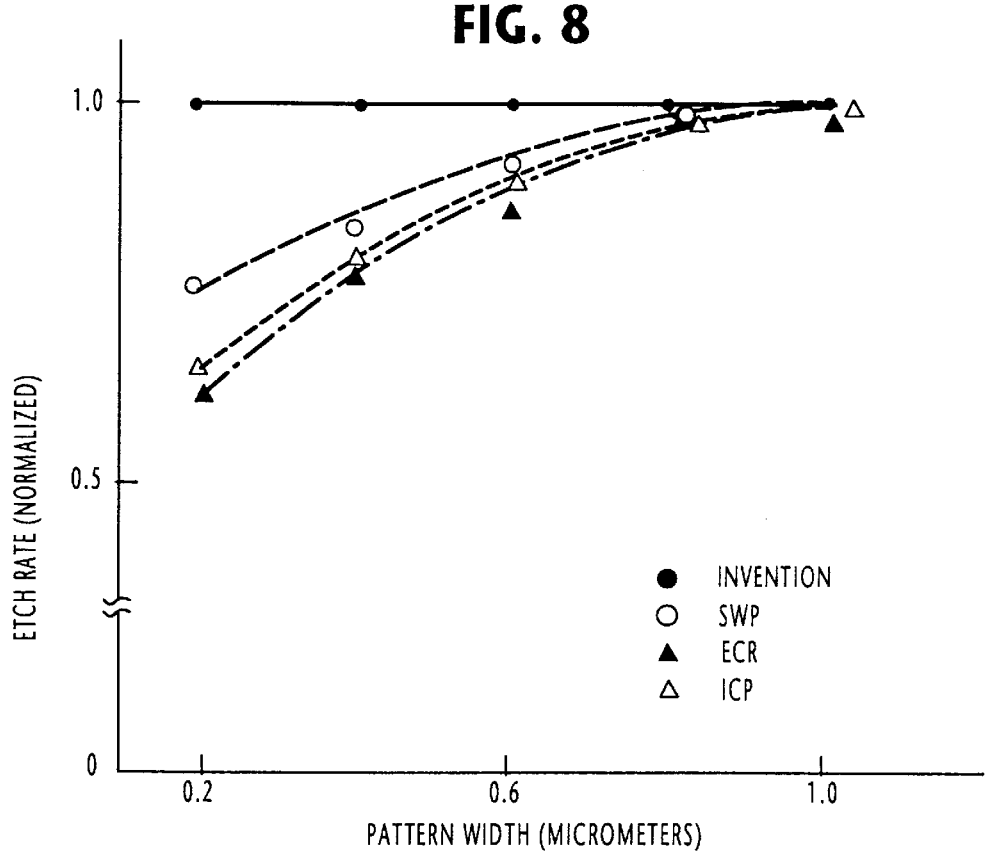
FIG. 8 is a graphic representation of measurements showing the etch rate versus pattern width relationship of the present invention in comparison with those of the conventional plasma assisted etching techniques.

Further experiments were undertaken to determine the dependency of silicon's pattern width on etch rate, and comparisons were made between the results obtained by the present invention and the conventional plasmas including the surface wave plasma (SWP), the electron cyclotron resonance plasma (ECR) and the inductive coupled plasma (ICP). FIG. 8 shows the pattern-width dependencies of the various methods by plotting normalized etch rate as a function of pattern width in the range between 0.2 and 1.0 micrometers. As shown in FIG. 8, the etch rate of the present invention remains constant over the 0.2–1.0 $\mu$m range. With the conventional plasmas, the etch rates for pattern widths narrower than 0.5 $\mu$m are 30 to 40 percent lower than the speeds for pattern widths of 1.0 $\mu$m.

While mention has been made of an embodiment in which the antenna array is driven at 500 MHz, experiments indicate that high density plasmas were obtained at low electron temperatures at 100 MHz upwards.

Figure 9:
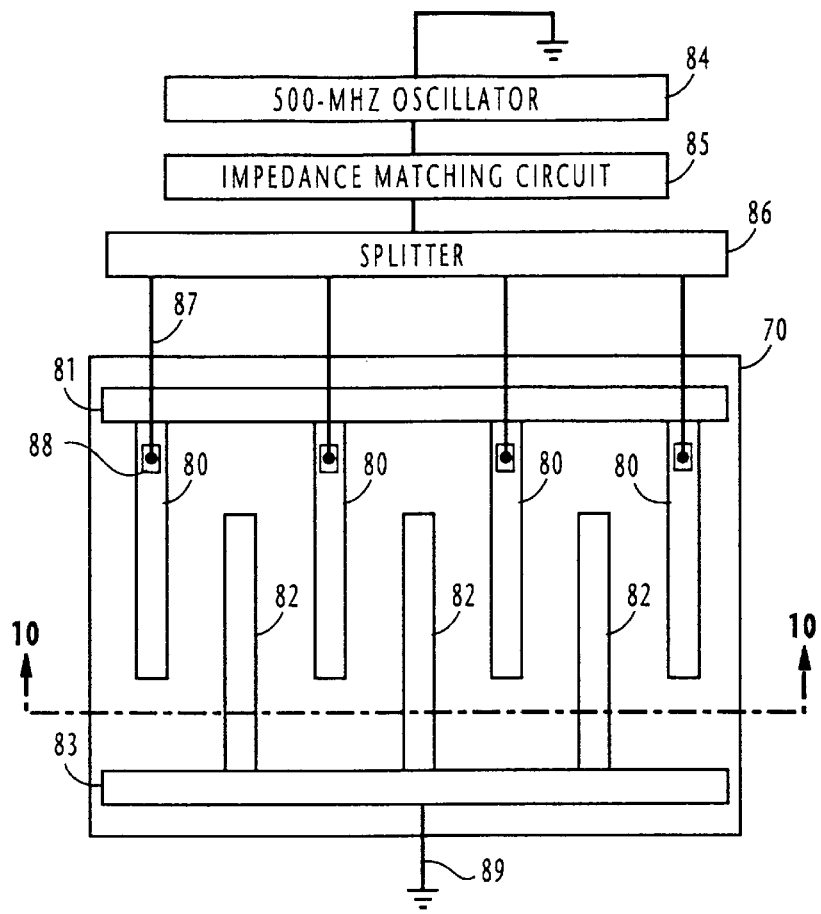
FIG. 9 is a plan view of a modified plasma chamber.
Figure 10:
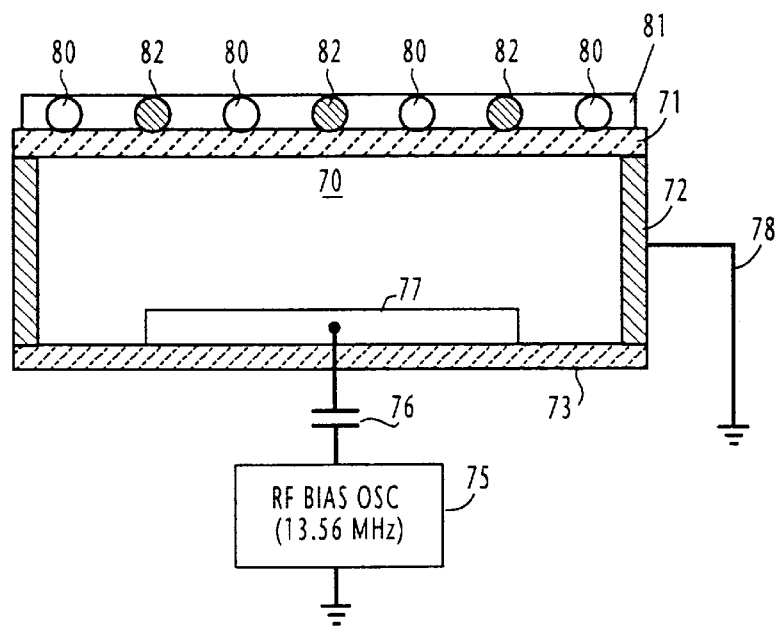
FIG. 10 is a cross-sectional view taken along the line 10 of FIG. 9.

A simple and yet effective plasma processing apparatus is shown in FIGS. 9 and 10. The plasma chamber, indicated at 70, has a dielectric top member 71, conductive side members 72 which are grounded at 78, and a nonconductive bottom member 73. An RF bias oscillator 75 is coupled by capacitor 76 to a wafer platen 77 through the bottom member 73.

On the upper surface of the dielectric top member 71 is provided an interdigital antenna array which comprises a first set of parallel antenna elements 80 of cylindrical shape and a second set of parallel antenna elements 82 of cylindrical shape arranged interdigitally with those of the first set. Each antenna element 80 is connected at one end to a first feeder element 81 and each antenna elements 82 is likewise connected at one end to a second feeder element 83 which is grounded by connection 89. Microwave energy produced by oscillator 84 is fed through impedance matching circuit 85 to splitter 86, where it is divided and distributed by conductors 87 to respective antenna elements 80 via connectors 88. As in the previous embodiment, high-frequency electromagnetic fields are produced around the antenna elements 80 of the first set and fields of opposite phase are produced by induction around the antenna elements 82 of the second sec.

What is claimed is:

1. A plasma processing apparatus comprising;
   a plasma chamber;
   an antenna array mounted adjacent said chamber, the antenna array comprising a first set of parallel antenna elements and a second set of parallel antenna elements interdigitally arranged with and parallel with the antenna elements of the first set;
   a wafer platen in the chamber; and
   an energy source for supplying oscillation energy of first phase to the first set of antenna elements and oscillation energy of second, opposite phase to the second set of antenna elements to produce oppositely moving energy fields in the plasma chamber at such a frequency that electrons are confined in a plasma produced in the plasma chamber.

2. A plasma processing apparatus as claimed in claim 1, further comprising an additional energy source coupled to said wafer platen for producing a bias oscillation field at a frequency lower than the frequency of said oppositely moving energy fields.

3. A plasma processing apparatus as claimed in claim 1, further comprising a variable capacitance element for imparting a variable capacitance to each of the antenna elements of said first and second sets.

4. A plasma processing apparatus as claimed in claim 1, further comprising means for modulating the oppositely moving energy fields with variable duty pulses.

5. A plasma processing apparatus as claimed in claim 2, further comprising means for modulating the bias oscillation field with variable duty pulses.

6. A plasma processing apparatus as claimed in claim 4, further comprising means for modulating the bias oscillation field with variable duty pulses.

7. A plasma processing apparatus as claimed in claim 1, further comprising a plurality of magnets for producing static magnetic fields to confine electrons in said plasma.

8. A plasma processing apparatus comprising:
   a plasma chamber formed by an electrically conductive top member, a dielectric cylindrical side member and a bottom member;
   a cylindrical structure formed by an electrically conductive annular top member, a cylindrical side member and an electrically conductive annular bottom member;

a first set of parallel antenna elements secured to said electrically conductive annular top member and a second set of parallel antenna elements secured to said electrically conductive annular bottom member, the antenna elements of said first set being interdigitally arranged with and parallel with the antenna elements of the second set;

a wafer platen in the chamber; and an energy source for supplying oscillation energy of first phase to the first set of antenna elements and oscillation energy of second, opposite phase to the second set of antenna elements to produce oppositely moving energy fields in said chamber at such a frequency that electrons are confined in a plasma produced in the chamber.

9. A plasma processing apparatus as claimed in claim 8, further comprising an additional energy source connected to the wafer platen and the electrically conductive top member of the plasma chamber for producing a bias oscillation field in the plasma chamber at a frequency lower than the frequency of the oppositely moving energy fields.

10. A plasma processing apparatus as claimed in claim 8, further comprising a variable capacitance element for imparting a variable capacitance co each of the antenna elements of said first and second sets.

11. A plasma processing apparatus as claimed in claim 8, further comprising means for modulating the oppositely moving energy fields with variable duty pulses.

12. A plasma processing apparatus as claimed in claim 9, further comprising means for modulating the bias oscillation field with variable duty pulses.

13. A plasma processing apparatus as claimed in claim 11, further comprising means for modulating a bias oscillation field with variable duty pulses.

14. A plasma processing apparatus as claimed in claim 8, further comprising a plurality of magnets for producing static magnetic fields to confine electrons in said plasma.

15. A plasma processing apparatus as claimed in claim 8, further comprising a variable DC voltage source connected to the electrically conductive top member for maintaining the plasma at a desired potential.

16. A plasma processing apparatus comprising:

a plasma chamber formed by a dielectric top member, a electrically conductive side members and a bottom member;

an antenna comprising a first set of parallel antenna elements each being connected at one end to a first feeder element and a second set of parallel antenna elements each being connected at one end to a second feeder element, the antenna elements of said first set being interdigitally arranged with and parallel with the antenna elements of the second set, a wafer platen in the chamber; and an energy source for supplying oscillation energy of first phase to the first set of antenna elements and oscillation energy of second, opposite phase to the second set of antenna elements to produce oppositely moving energy fields in said chamber at such a frequency that electrons are confined in a plasma produced in the chamber.

17. A plasma processing apparatus as claimed in claim 16, further comprising an additional energy source connected to the wafer platen and the electrically conductive side members of the plasma chamber for producing a bias oscillation field in the plasma chamber at a frequency lower than the frequency of the oppositely moving energy fields.

18. The plasma processing apparatus as claimed in claim 1, wherein the first and second sets of antenna elements are arranged in an annular ring about a periphery of said plasma chamber.

19. The plasma processing apparatus as claimed in claim 1, wherein each antenna element in said first and second sets of antenna elements is cylindrical in shape.

20. The plasma processing apparatus as claimed in claim 1, wherein said plasma chamber includes a top member, a bottom member, and a side member, wherein each antenna element in said first and second sets of antenna elements is parallel with said side member.

21. The plasma processing apparatus as claimed in claim 20, wherein said side member is cylindrical.

22. The plasma processing apparatus as claimed in claim 1, further comprising a plurality of variable capacitive elements corresponding to each of the elements in said first and second sets of antenna elements.

23. The plasma processing apparatus as claimed in claim 22, wherein each of said variable capacitive elements comprises a part-cylindrical conductive member secured to one end of an adjusting screw for adjusting the distance between the part-cylindrical conductive member and a corresponding antenna element.

24. The plasma processing apparatus as claimed in claim 8, wherein the first and second sets of antenna elements are arranged in an annular ring about a periphery of said plasma chamber.

25. The plasma processing apparatus as claimed in claim 8, wherein each antenna element in said first and second sets of antenna elements is cylindrical in shape.

26. The plasma processing apparatus as claimed in claim 8, wherein each antenna element in said first and second sets of antenna elements is parallel with said cylindrical side member.

27. The plasma processing apparatus as claimed in claim 8, further comprising a plurality of variable capacitive elements corresponding to each of the elements in said first and second set of antenna elements.

28. The plasma processing apparatus as claimed in claim 22, wherein each of said variable capacitive elements comprises a part-cylindrical conductive member secured to one end of an adjusting screw for adjusting the distance between the part-cylindrical conductive member and a corresponding antenna element.

* * * * *